(12) United States Patent
Schultz

(10) Patent No.: US 12,308,370 B2
(45) Date of Patent: May 20, 2025

(54) CROSS FIELD EFFECT TRANSISTORS (XFETs) IN INTEGRATED CIRCUITS

(71) Applicant: Advanced Micro Devices, Inc., Santa Clara, CA (US)

(72) Inventor: Richard T. Schultz, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 780 days.

(21) Appl. No.: 17/489,221

(22) Filed: Sep. 29, 2021

(65) Prior Publication Data

US 2023/0102901 A1 Mar. 30, 2023

(51) Int. Cl.
*H01L 29/78* (2006.01)
*H01L 29/06* (2006.01)
(Continued)

(52) U.S. Cl.
CPC ...... *H01L 29/7827* (2013.01); *H01L 29/0665* (2013.01); *H01L 29/1029* (2013.01); *H01L 29/66666* (2013.01)

(58) Field of Classification Search
CPC ............. H01L 29/7827; H01L 29/0665; H01L 29/1029; H01L 29/66666;
(Continued)

(56) References Cited

U.S. PATENT DOCUMENTS 6,156,600 A 12/2000 Chao et al.
7,723,806 B2 5/2010 Liaw
(Continued)

FOREIGN PATENT DOCUMENTS

EP 3979305 A1 4/2022
JP S6035564 A 2/1985
(Continued)

OTHER PUBLICATIONS

International Search Report and Written Opinion in International Application No. PCT/US2017/052339, mailed Dec. 6, 2017, 15 pages.

(Continued)

*Primary Examiner* — Mohammad M Hoque
(74) *Attorney, Agent, or Firm* — Kowert, Hood, Munyon, Rankin & Goetzel, P.C.; Rory D. Rankin

(57) ABSTRACT

A system and method for creating layout for standard cells are described. In various implementations, a standard cell uses Cross field effect transistors (FETs) that include vertically stacked gate all around (GAA) transistors with conducting channels oriented in an orthogonal direction between them. The direction of current flow of the top GAA transistor is orthogonal to the direction of current flow of the bottom GAA transistor. The channels of the vertically stacked transistors use opposite doping polarities. The orthogonal orientation allows both the top and bottom GAA transistors to have the maximum mobility for their respective carriers based on their orientation. The Cross FETs utilize a single metal layer and a single via layer for connections between the top and bottom GAA transistors.

20 Claims, 12 Drawing Sheets

(51) Int. Cl.
  *H01L 29/10*  (2006.01)
  *H01L 29/66*  (2006.01)

(58) Field of Classification Search
  CPC ..... H01L 21/823807; H01L 21/823871; H01L 27/0688; H01L 27/092; H01L 21/8221; H01L 27/0924; H01L 27/0207; H01L 27/0922; H01L 29/0673; H01L 29/42392; H01L 29/78696
  USPC .......................................................... 257/213
  See application file for complete search history.

(56) References Cited

U.S. PATENT DOCUMENTS

| | | |
|---|---|---|
| 8,063,450 B2 | 11/2011 | Wernersson et al. |
| 8,561,003 B2 | 10/2013 | Kawa et al. |
| 9,425,318 B1 | 8/2016 | Hoentschel et al. |
| 9,704,995 B1 | 7/2017 | Schultz |
| 10,068,794 B2 | 9/2018 | Schultz |
| 10,186,510 B2 | 1/2019 | Schultz |
| 10,304,728 B2 | 5/2019 | Schultz |
| 10,608,076 B2 | 3/2020 | Schultz |
| 11,120,190 B2 | 9/2021 | Schultz |
| 11,189,569 B2 | 11/2021 | Schultz et al. |
| 2001/0041402 A1 | 11/2001 | Yamamoto |
| 2006/0216897 A1 | 9/2006 | Lee et al. |
| 2007/0157144 A1 | 7/2007 | Mai et al. |
| 2007/0170471 A1 | 7/2007 | Joly et al. |
| 2007/0278528 A1 | 12/2007 | Ato et al. |
| 2009/0187871 A1 | 7/2009 | Cork |
| 2010/0148219 A1 | 6/2010 | Shimizu |
| 2011/0151668 A1 | 6/2011 | Tang et al. |
| 2012/0007051 A1 | 1/2012 | Bangsaruntip et al. |
| 2012/0138886 A1 | 6/2012 | Kuhn et al. |
| 2013/0155753 A1 | 6/2013 | Moon et al. |
| 2013/0161792 A1 | 6/2013 | Tran et al. |
| 2014/0106474 A1 | 4/2014 | Chen et al. |
| 2014/0145342 A1 | 5/2014 | Schultz et al. |
| 2014/0183643 A1 | 7/2014 | Colinge et al. |
| 2014/0374879 A1 | 12/2014 | Chen et al. |
| 2015/0061087 A1 | 3/2015 | Hong |
| 2015/0144880 A1 | 5/2015 | Rachmady et al. |
| 2015/0243519 A1 | 8/2015 | deVilliers |
| 2015/0295036 A1 | 10/2015 | Hong |
| 2015/0370951 A1 | 12/2015 | Kawa et al. |
| 2015/0372104 A1 | 12/2015 | Liu et al. |
| 2019/0304974 A1* | 10/2019 | Sharma ............... H01L 27/1207 |
| 2020/0035560 A1 | 1/2020 | Block et al. |
| 2021/0074350 A1* | 3/2021 | Vincent ................ G11C 11/417 |
| 2021/0376137 A1 | 12/2021 | Yang et al. |
| 2023/0096652 A1 | 3/2023 | Schultz |
| 2023/0161940 A1 | 5/2023 | Hoover et al. |

FOREIGN PATENT DOCUMENTS

| | | |
|---|---|---|
| WO | 2014051769 A1 | 4/2014 |
| WO | 2015199644 A1 | 12/2015 |

OTHER PUBLICATIONS

Dargis et al., "Epitaxial Growth and Properties of Silicon on Crystalline Rare-Earth-Metal Oxide for SOI-Applications" Materials Science, May 1, 2009, pp. 11-15, vol. 15, No. 1.

Schultz, Richard T., U.S. Appl. No. 17/489,276, entitled "Cross Field Effect Transistor (XFET) Library Architecture Power Routing", filed Sep. 29, 2021, 46 pages.

International Search Report and Written Opinion in International Application No. PCT/US2022/076562, mailed Dec. 19, 2022, 16 pages.

International Search Report and Written Opinion in International Application No. PCT/US2024/030234, mailed Aug. 27, 2024, 12 pages.

* cited by examiner

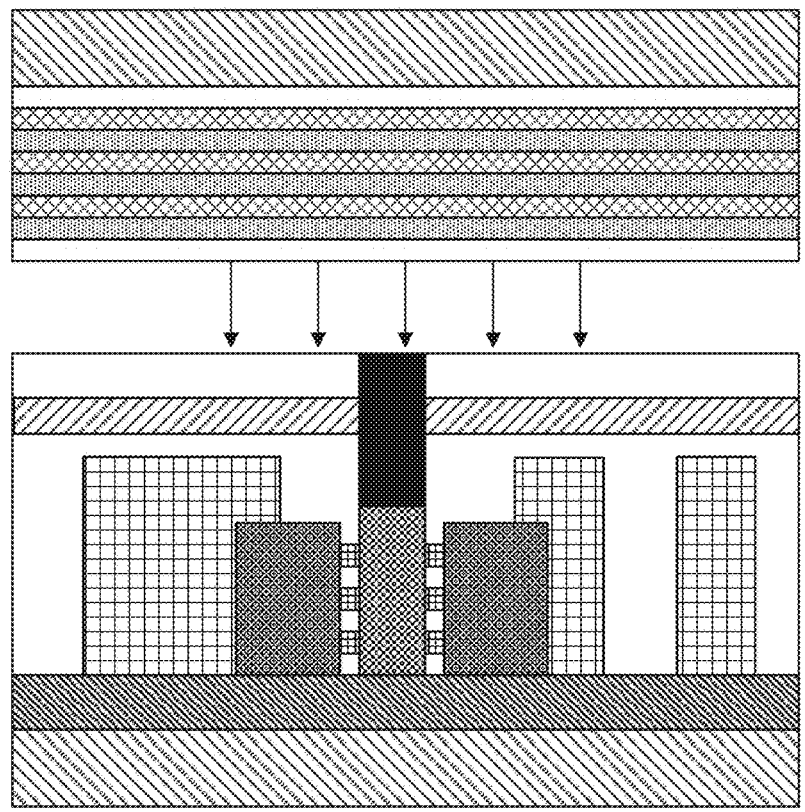
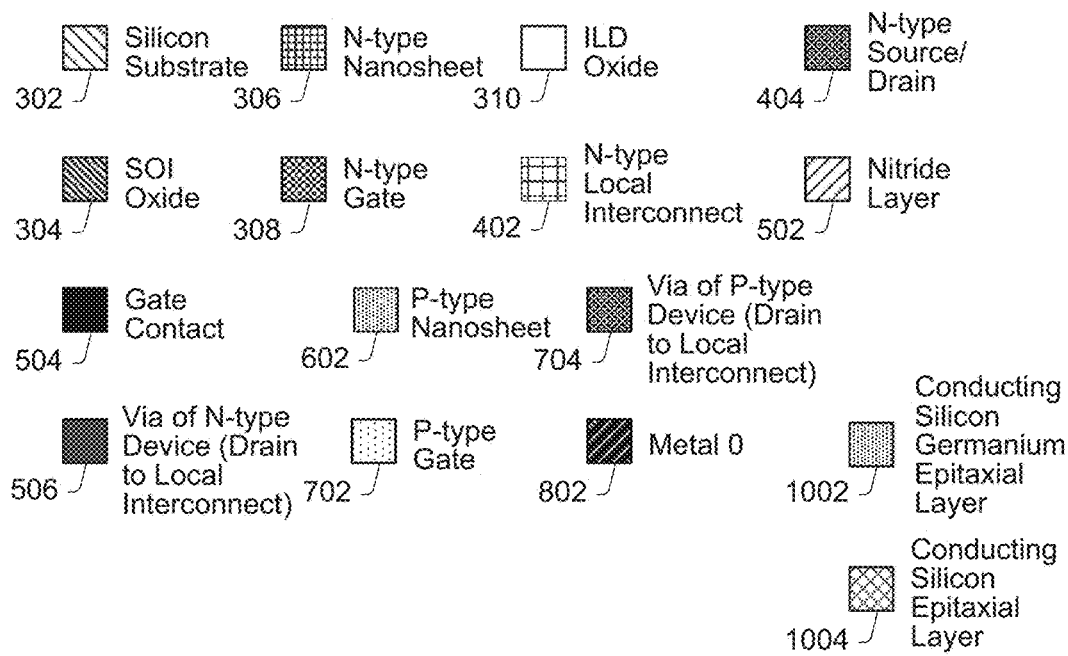
FIG. 10

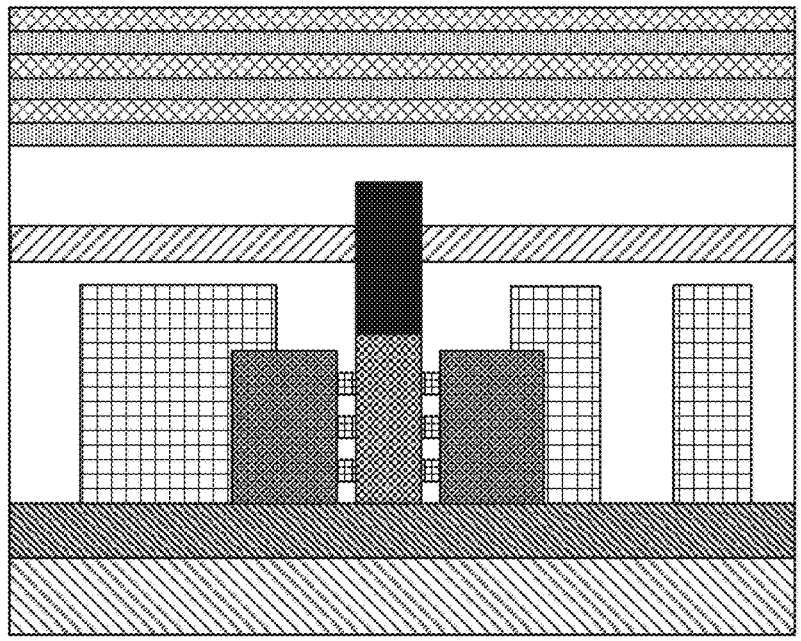

*Standard Cell Layout 1100*

| | | | |
|---|---|---|---|
| 302 Silicon Substrate | 306 N-type Nanosheet | 310 ILD Oxide | 404 N-type Source/Drain |
| 304 SOI Oxide | 308 N-type Gate | 402 N-type Local Interconnect | 502 Nitride Layer |
| 504 Gate Contact | 602 P-type Nanosheet | 704 Via of P-type Device (Drain to Local Interconnect) | 1002 Conducting Silicon Germanium Epitaxial Layer |
| 506 Via of N-type Device (Drain to Local Interconnect) | 702 P-type Gate | 802 Metal 0 | 1004 Conducting Silicon Epitaxial Layer |

*FIG. 11*

CROSS FIELD EFFECT TRANSISTORS (XFETs) IN INTEGRATED CIRCUITS

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electro migration, short channel effects such as at least leakage currents, and processing yield are some issues which affect the placement of devices and the routing of signals across an entire die of a semiconductor chip. These issues have the potential to delay completion of the design and affect the time to market.

In order to shorten the design cycle for semiconductor chips, manual full-custom designs are replaced with automation where possible. In some cases, a standard cell layout is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, pin access, and so on. Therefore, designers manually create these cells to achieve better results for the multiple characteristics or rewrite the rules for the place-and-route tool. However, many times, the layout tools and rules are setup for planer devices, rather than for the relatively recent non-planar devices.

In view of the above, efficient methods and systems for creating layout for standard cells are desired.

BRIEF DESCRIPTION OF THE DRAWINGS

FIG. 10 is a generalized diagram of a top view of a standard cell layout utilizing that uses Cross FETs.

FIG. 11 is a generalized diagram of a top view of a standard cell layout utilizing that uses Cross FETs.

Figure 1:
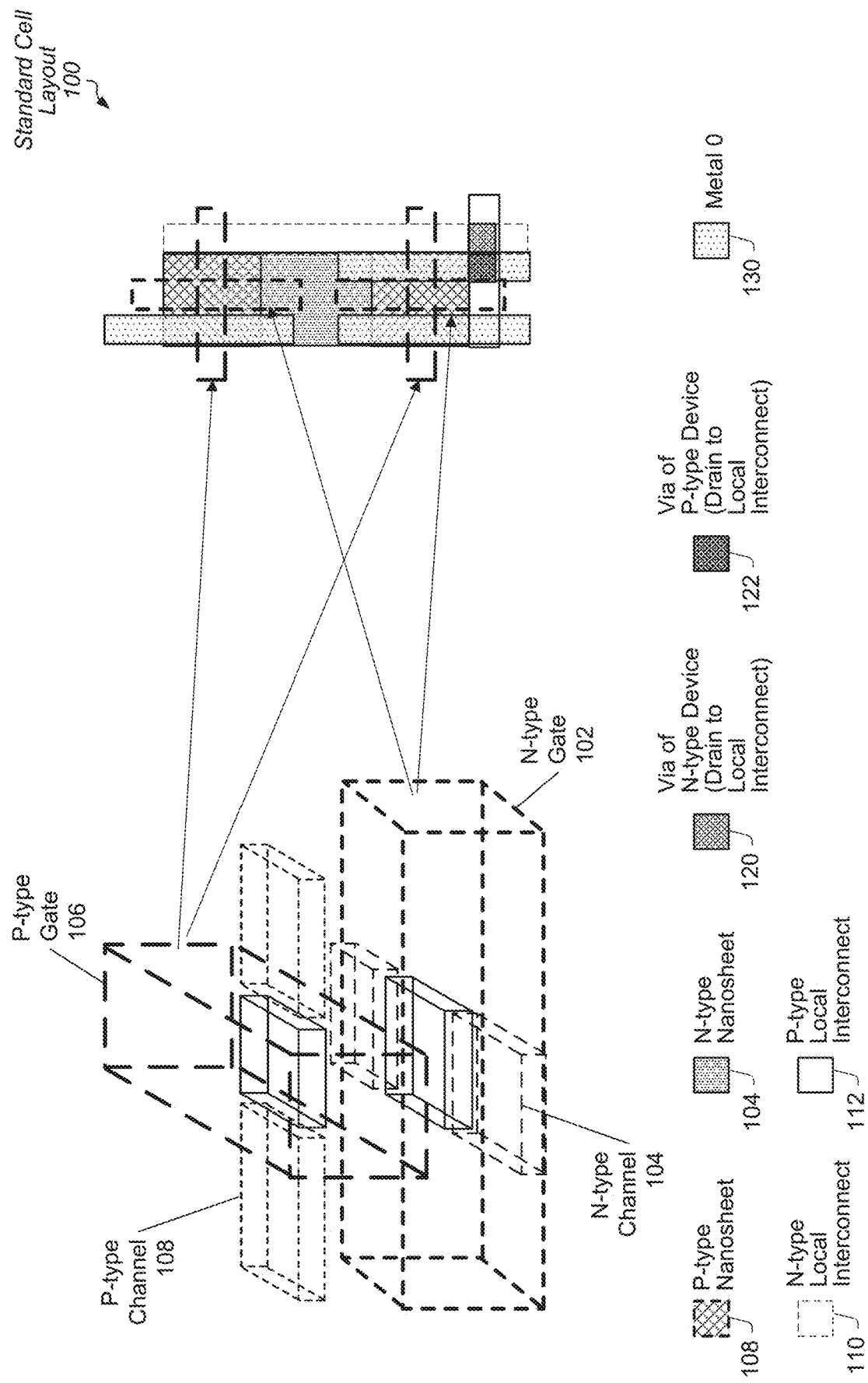
FIG. 1 is a generalized diagram of a top view of a standard cell layout utilizing that uses Cross field effect transistors (FETs).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for creating layout for standard cells are contemplated. In various implementations, one or more standard cells include cross field effect transistors (FETs). As used herein, "Cross FETs" are also referred to as a "XFETs." Additionally, as used herein, a "transistor" is also referred to as a "semiconductor device" or a "device." In some implementations, the Cross FETs are vertically stacked gate all around (GAA) transistors such as a top vertical GAA transistor (or GAA transistor) is formed vertically on top of a bottom GAA transistor with at least an isolating oxide layer in between the two GAA transistors. In addition, the top GAA transistor has one or more conducting channels positioned orthogonal to the one or more conducting channels of the bottom GAA transistor. Therefore, the direction of current flow of the top GAA transistor through one or more top channels is orthogonal to the direction of current flow of the one or more bottom channels of the bottom GAA transistor.

The top GAA transistor has a doping polarity of one or more top channels that is an opposite polarity of the doping polarity of one or more bottom channels of the bottom GAA transistor. For example, in an implementation, the top GAA transistor includes one or more p-type channels, whereas, the bottom GAA transistor includes one or more n-type channels. In another implementation, the p-type and n-type polarities are reversed between the one or more channels of the top GAA transistor and the bottom GAA transistor. With the orthogonal orientation between the top GAA transistor and the bottom GAA transistor, both the top and bottom GAA transistors have the maximum mobility for their respective carriers based on their orientation.

In contrast to vertical GAA transistors, Fin field effect transistors (Fin FETs) have a Fin of doped silicon that has physical contact with the silicon substrate. The channels of vertical GAA devices do not have physical contact with the silicon substrate. Generally, when compared to Fin FETs, GAA transistors provide lower threshold voltages, faster switching times, less leakage currents, and further reduction of short channel effects. In some implementations, a channel of doped silicon of the GAA transistor is a nanowire. In other implementations, a channel of doped silicon of the GAA transistor is a nanosheet. A nanosheet is a sheet of doped silicon, rather than a wire of doped silicon. In other words, the nanosheet is a wider and thicker conductive wire than a lateral nanowire. The nanosheet can also be considered as a Fin that is rotated and placed on its side vertically above the silicon substrate such that the nanosheet does not have physical contact with the silicon substrate. Rather, metal gate is formed between the nanosheet and the silicon substrate. This visualization, though, does not describe the actual fabrication steps for forming the nanosheet.

Vertically stacking a top GAA transistor on top of a bottom GAA transistor further increases performance, reduces power consumption, reduces on-die area consumed by the GAA transistors, and further reduces short channel effects. Complementary FETs (CFETs) include a top GAA transistor vertically stacked on top of a bottom GAA transistor with at least an oxide layer in between for isolation. However, CFETs uses a top GAA transistor with one or more channels aligned in a same direction as the one or more channels of the bottom GAA transistor. As described earlier, Cross FETs, though, have an orthogonal orientation between the one or more channels of the top GAA transistor and the one or more channels of the bottom GAA transistor. Compared to Complementary FETs, Cross FETs have better mobility for each of the top GAA transistor and the bottom GAA transistor, which leads to higher performance. Complementary FETs use two metal layers and three via layers to create connections between the top GAA transistor and the bottom GAA transistor. In contrast, Cross FETs utilize a single metal layer and a single via layer for connections between the top and bottom GAA transistors. Cross FETs have the bottom GAA transistor formed in a first wafer while the top GAA transistor is formed in a second wafer using conventional semiconductor fabrication steps. The first wafer and the second wafer are connected to one another through a hybrid bond process, which increases yield.

In various implementations, a semiconductor device fabrication process for creating Cross FETs in one or more standard cells of an integrated circuit includes forming a bottom GAA transistor on a silicon substrate of a bottom wafer. The bottom GAA transistor includes one or more channels formed above the silicon substrate with at least metal gate between the channels and the silicon substrate. The process uses a hybrid bond to connect a top wafer to the bottom wafer. At least an isolating oxide layer is used between the top wafer and the bottom wafer. The process forms a top GAA transistor in the top wafer with the one or more channels of the top GAA transistor being positioned with an orthogonal orientation to the one or more channels of the bottom GAA transistor. The process further places a single gate contact with one end directly connected to the metal gate of the bottom GAA transistor and another end directly connected to the metal gate of the top GAA transistor. For drain region connections, the process utilizes a single via layer. When a power supply voltage is applied to an input node of a given standard cell of the one or more standard cells, a current is conveyed from the input node to an output node of the given standard cell through one of the top GAA transistor and the bottom GAA transistor.

In the following description, the standard cell layout architecture shown in FIGS. 1-8 and 10-11 provide standard cells for devices in integrated circuits where the standard cells use Cross FETs. The FIGS. 1-8 and 10-11 illustrate the layout of an inverter using vertical gate all around (GAA) devices that include Cross FETs. However, the layout techniques shown in FIGS. 1-8 and 10-11 can be used for a variety of other standard cells used for other complex gates and functional units. In addition, the layout techniques shown in FIGS. 1-8 and 10-11 can be used for an inverter using Fin FET devices placed in a manner to create Cross FETs. In one implementation, a p-type Fin FET is vertically stacked on top of an n-type Fin FET with an orthogonal orientation between the p-type channel and the n-type channel. In another implementation, the n-type Fin FET is vertically stacked on top of the p-type Fin FET with an orthogonal orientation between the p-type channel and the n-type channel. In yet other implementations, the Fin FETs are replaced with Trigate devices.

Turning now to FIG. 1, a generalized block diagram of a top view of a standard cell layout 100 is shown that uses Cross FETs. The standard cell layout 100 is for a 2-input Boolean NAND gate using Cross FETs. However, in other implementations, the characteristics and techniques used for standard cell layout 100 is used for a variety of other types of Boolean gates and complex gates. A three-dimensional (3-D) illustration of the p-type and n-type Cross FETs accompanies the layout 100. As shown, a p-type device is vertically stacked on an n-type device. The n-type device includes at least an n-type gate 102 formed all around an n-type channel 104. Similarly, a p-type gate 106 is formed all around a p-type channel 108. Therefore, the p-type channel 108 has a doping polarity that is an opposite polarity of the n-type channel 104 of the bottom n-type device. Although a single n-type channel 104 and a single p-type channel 108 is shown, in other implementations, the semiconductor devices include another number of channels. In some implementations, the channel is a lateral nanowire. In other implementations, the channel is a nanosheet.

The n-type channel 104 and the n-type gate 102 are oriented in an orthogonal direction to the p-type channel 108 and the p-type gate 106. In other words, the n-type channel 104 and the n-type gate 102 are oriented in a direction that is 90 degrees from a direction of the p-type channel 108 and the p-type gate 106. Therefore, the direction of current flow of the bottom n-type device through the n-type channel 104 is orthogonal to the direction of current flow of the p-type channel 108 of the top p-type device. With the orthogonal orientation between the top p-type device and the bottom n-type device, both devices have the maximum mobility for their respective carriers based on their orientation. In addition, the orthogonal orientation of the top p-type device and the bottom n-type device allow connections between the vertically stacked devices to use a single via layer.

In the standard cell layout 100, the metal zero layer (M0 or Metal0) 130 is the top-most layer. A gate contact would be a next vertically highest layer, but the gate contacts are not shown for ease of illustration. The p-type gate 106 is the next vertically highest layer followed by the p-type nanosheet 108, which creates the p-type channel. Insulating layers are between the top p-type device and the bottom n-type device with a gate contact formed between the devices in the insulating layers. This gate contact is not shown with the aerial top view provided by the standard cell layout 100 (or layout 100). Cross-section views of standard cell layout are provided later. The gate contact between the vertically stacked devices is directly connected to the p-type metal gate 106 and the n-type metal gate 102 without traversing any metal layers.

The via (or contact) 122 of the p-type device connects the drain region of the p-type device to local interconnect 112 of the p-type device. The via (or contact) 120 of the n-type device connects the drain region of the n-type device to local interconnect 110 of the n-type device. The vertically stacked devices of the layout 100 consumes less on-die area. The use of a single via layer reduces resistance and capacitance of the circuit. Compared to Fin FETs, the use of gate all around (GAA) nanowires or nanosheets provides lower threshold voltages, faster switching times, less leakage currents, and further reduction of short channel effects. Examples of short channel effects other than leakage current are latchup effects, drain-induced barrier lowering (DIBL), punchthrough, performance dependency on temperature, impact ionization, and parasitic capacitance to the silicon substrate and to the wells used for the source and drain regions.

One advantage of the orthogonal orientation of the Cross FETs in the layout 100 includes a single via layer. In contrast, Complementary FETs (CFETs) use multiple metal layers and multiple via layers to make connections between vertically stacked devices. Gaining access to the source and drain regions of the bottom device of Cross FETs is easier than compared with CFETs. Another advantage of the orthogonal orientation of the Cross FETs in the layout 100 is use of the maximum mobility of each of the carriers in each device of the vertically stacked devices.

Figure 2:
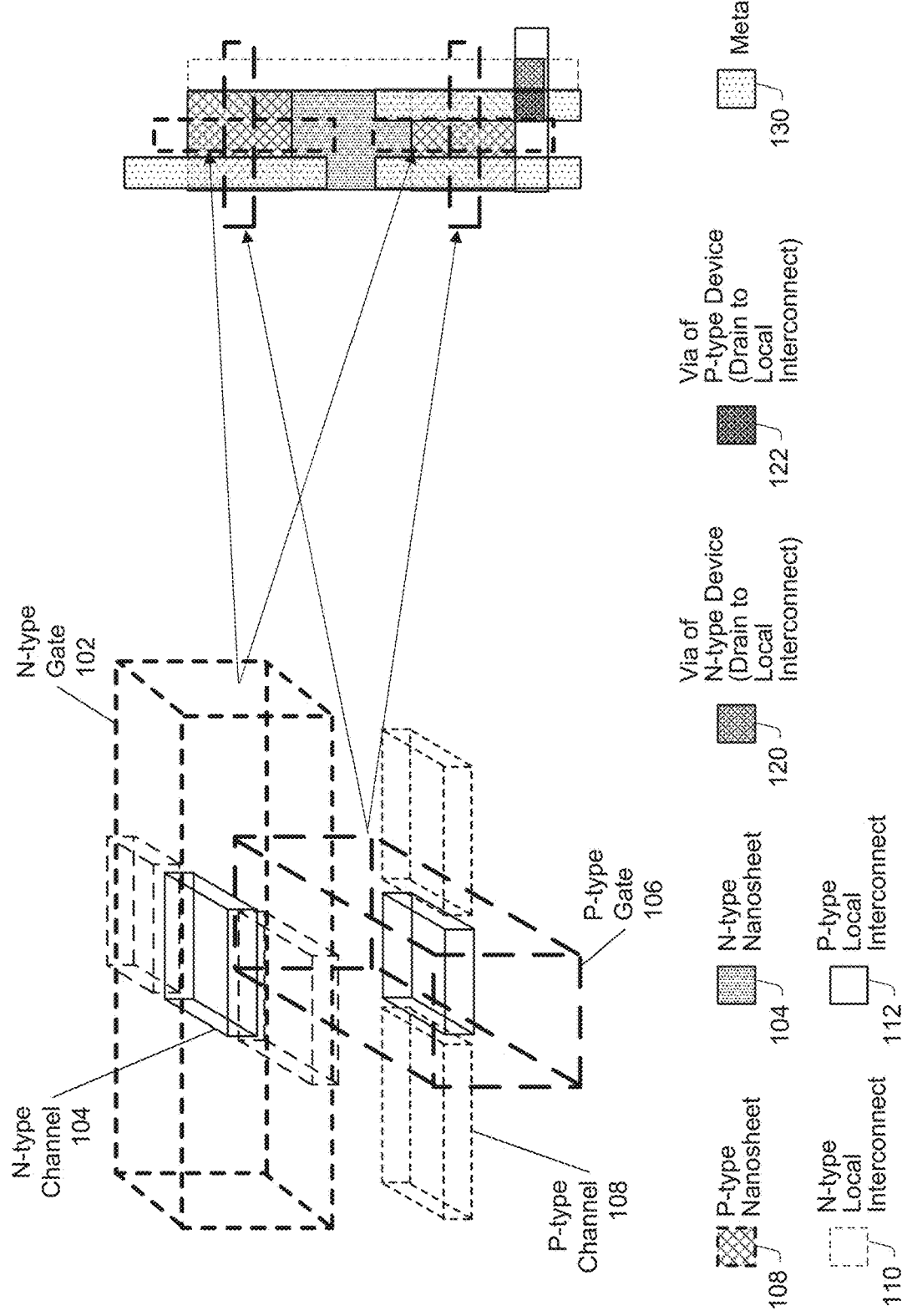
FIG. 2 is a generalized diagram of a top view of a standard cell layout utilizing that uses Cross FETs.

Turning now to FIG. 2, a generalized block diagram of a top view of a standard cell layout 200 is shown. The standard cell layout 200 is for a 2-input Boolean NAND gate using Cross FETs. A three-dimensional (3-D) illustration of the p-type and n-type Cross FETs accompanies the layout 200. Contacts (or vias), materials and structures described earlier are numbered identically. As shown, an n-type device is vertically stacked on a p-type device. Similar to the layout 100, in other implementations, the Cross FETs of the layout 200 use multiple n-type channels 104 and multiple p-type channels 108. Similar to the layout 100, the layout 200 uses an orthogonal orientation between the n-type channel 104 and the p-type channel 108, and uses a single via layer to create connections between the vertically stacked devices.

In the following description, the standard cell layout architecture using Cross FETs is shown in FIGS. 3-8. The layout architecture for standard cells using Cross FETs is different than layout architectures used for standard cells that include Fin FETs, horizontal GAA devices or Trigate devices, or Complementary FETs. The FIGS. 3-8 illustrate the layout of an inverter using Cross FETs. However, the layout techniques shown in FIGS. 3-8 can be used for a variety of other standard cells used for other complex gates and functional units.

Figure 3:
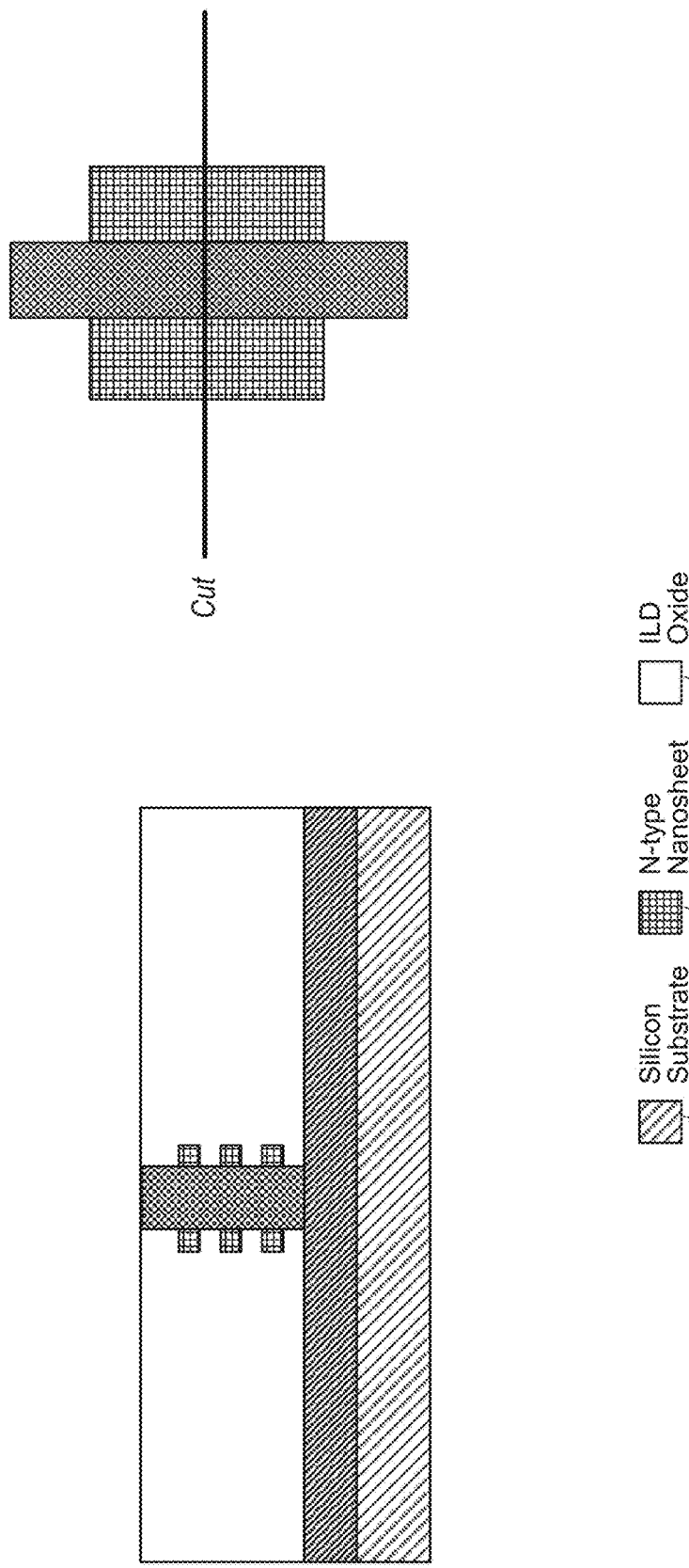
FIG. 3 is a generalized diagram of a top view of a standard cell layout utilizing that uses Cross FETs.

Referring to FIG. 3, a generalized block diagram of a top view of a standard cell layout 300 is shown. The standard cell layout 300 (or layout 300) on the right is for an inverter using Cross FETs. A cross-sectional view of the semiconductor layers used in the layout 300 also accompanies the layout 300. The top view of the layout 300 is shown on the right, and the cross-sectional view is shown on the left. For this inverter, a p-type device is being vertically stacked on an n-type device. However, in other implementations, it is possible and contemplated to have an n-type device vertically stacked on a p-type device. Each of the devices of the inverter uses gate all around (GAA) metal that wraps around one or more nanosheets in the gate region in a 360-degree manner. The bottom n-type device is fabricated on a first wafer. The top p-type device is fabricated on a separate second wafer, which is then bonded to the first wafer as described later.

Here, in layout 300, a silicon on insulator (SOI) oxide layer 304 is deposited on the silicon substrate 302. In various implementations, the SOI oxide layer 304 is a silicon dioxide (SiO2) layer. The semiconductor device fabrication process is building a local silicon on insulator (SOI) which insulates the body of the device from the silicon substrate 302. In an implementation, the formed SOI oxide layer 304 is relatively thick. For example, the thickness of the silicon dioxide layer 205 is at least an order of magnitude greater than a thickness of a thin gate silicon dioxide layer formed in a later processing step for depositing silicon dioxide on nanowires. In an implementation, the SOI oxide layer 304 is formed by a plasma-enhanced chemical vapor deposition (PECVD) process. After the SOI oxide layer 304 is deposited, a chemical mechanical planarization (CMP) step is used to remove unwanted silicon dioxide and to polish the remaining SOI oxide layer 304 on the silicon wafer. The CMP step achieves a near-perfect flat and smooth surface upon which further layers of integrated circuitry are built. Following this, the SOI oxide layer 304 is etched to the desired thickness.

Following, a stack of channels is formed over the SOI oxide layer 304. In an implementation, the stack of channels are n-type nanosheets 306. In some implementations, a separate wafer has alternating layers grown such as a silicon germanium semiconducting epitaxial growth layer alternating with a silicon semiconducting epitaxial growth layer. The separate wafer with the alternating layers is bonded to the top of the SOI oxide layer 304. The bonding is performed by any of a number of wafer-to-wafer bonding techniques such as copper-based wafer bonding, which is also known as thermo-compression bonding, and oxide-oxide bonding, which is also known as molecular, fusion or direct wafer bonding. The n-type nanosheets 306 are created from the stack of alternating layers by etching the layers to the size of the n-type nanosheets 306 using one of a sidewall image transfer (SIT) process, extreme ultraviolet (EUV) lithography, directed self-assembly (DSA) patterning via chemo epitaxy or self-aligned customization. In other implementations, the alternating layers are grown on top of the SOI oxide layer 304 followed by one of the named processes for etching the layers to the size of the n-type nanosheets 306.

A given conduction layer of the alternating silicon germanium semiconducting epitaxial growth layer and silicon semiconducting epitaxial growth layer is selected to remain for forming the gate region. Afterward, any semiconducting layer other than the selected layer is removed. Gate metal material 308 is deposited followed by CMP steps to polish the gate metal 308. In various implementations, titanium nitride (TiN) is used for the gate metal 308. The gate metal 308 is provided all around the n-type nanosheets 306 in a 360-degree manner. An interlayer dielectric (ILD) oxide layer 310 is deposited around the gate region.

Figure 4:
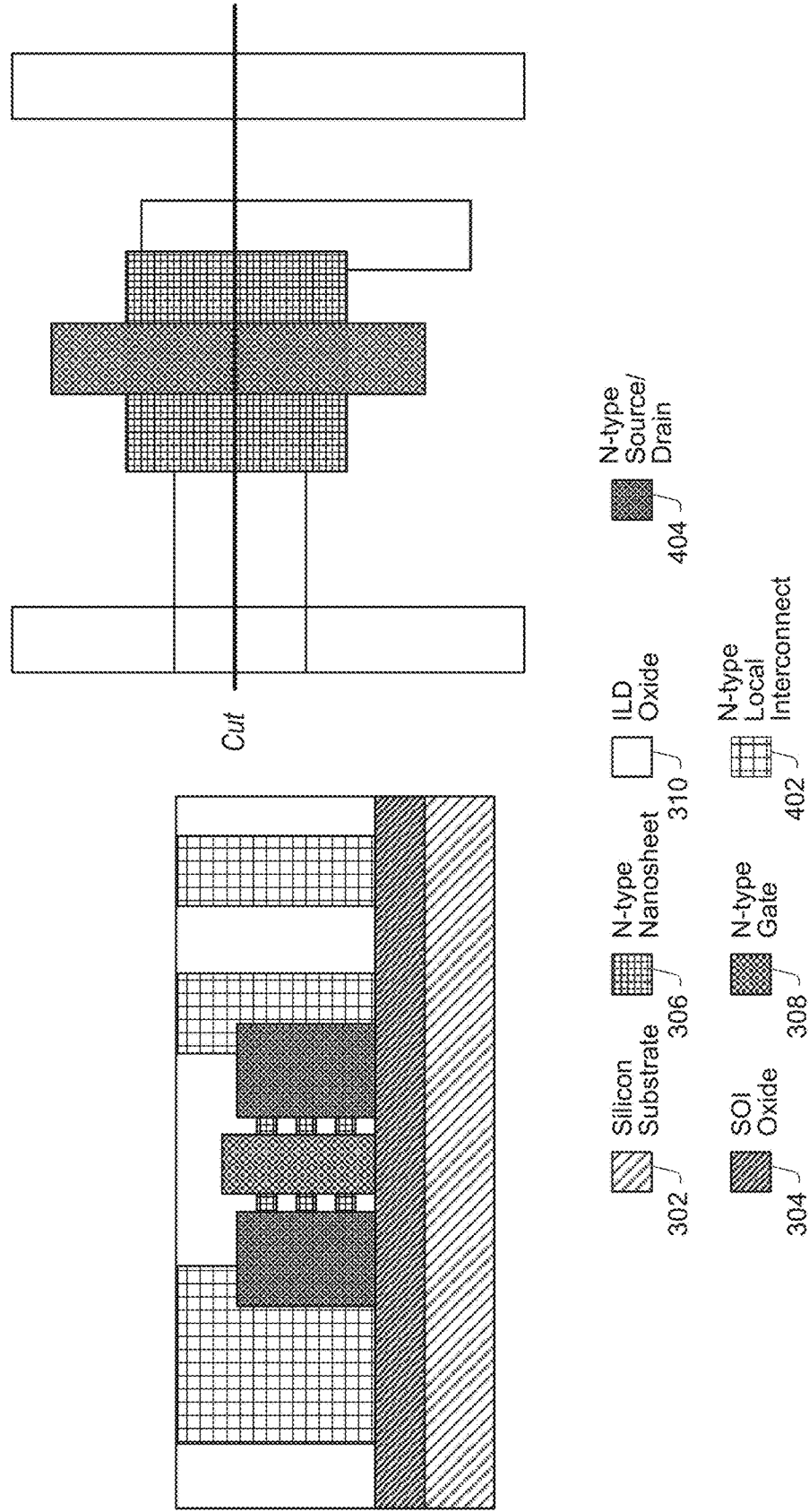
FIG. 4 is a generalized diagram of a top view of a standard cell layout utilizing that uses Cross FETs.

Referring to FIG. 4, a generalized block diagram of a top view of a standard cell layout 400 is shown. The standard cell layout 400 (or layout 400) on the right is a continuation of the semiconductor processing steps being performed on the layout 300 for an inverter using Cross FETs. A cross-sectional view of the semiconductor layers used in the layout 400 also accompanies the layout 400. The top view of the layout 400 is shown on the right, and the cross-sectional view is shown on the left. The n-type source and drain regions 404 are formed. In an implementation, the n-type source and drain regions 404 are epitaxially grown silicon doped with Phosphorous. Afterward, the n-type local interconnect 402 is formed. In some implementations, n-type local interconnect 402 includes the tungsten, cobalt, ruthenium, or molybdenum.

Figure 5:
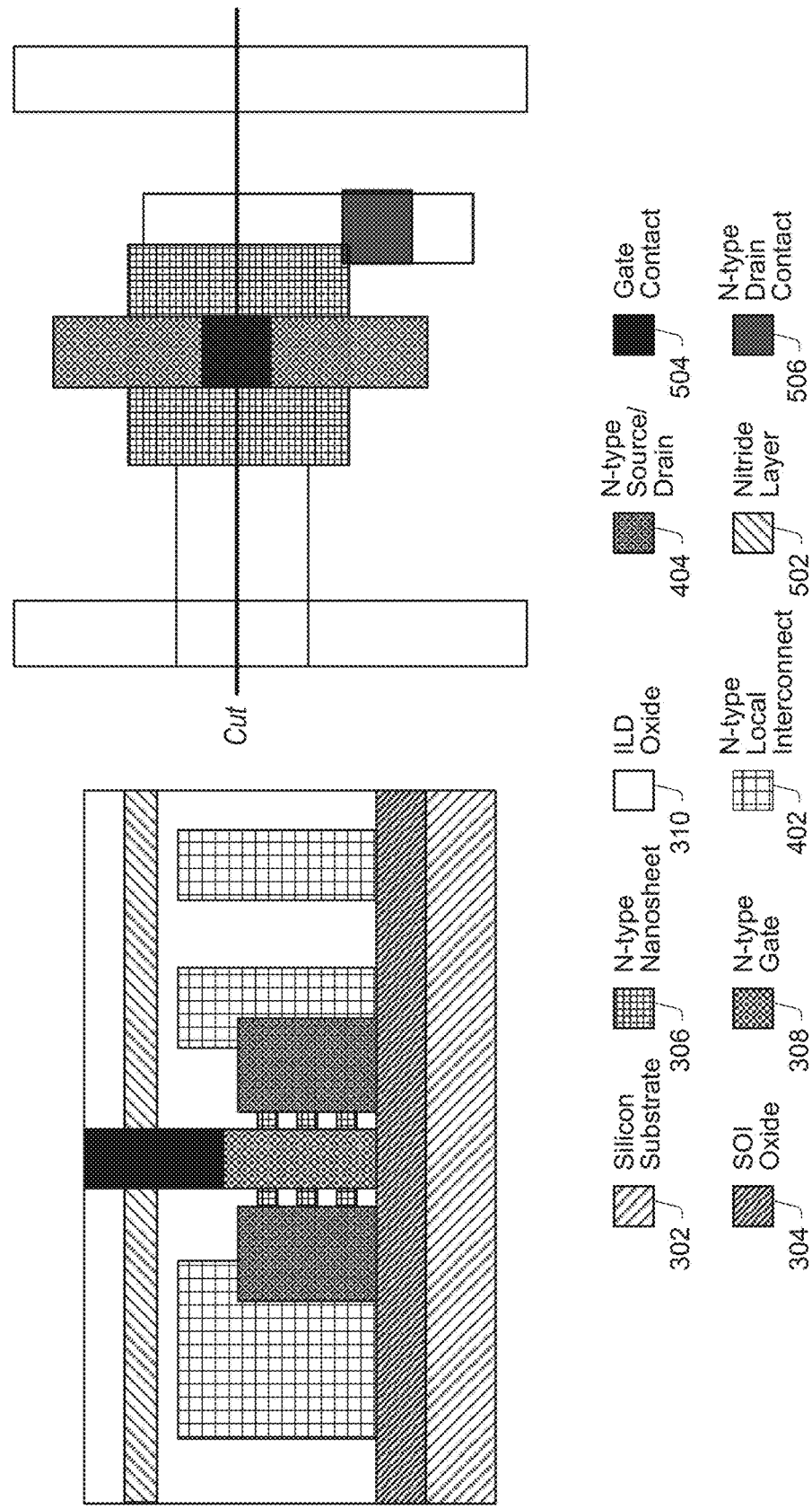
FIG. 5 is a generalized diagram of a top view of a standard cell layout utilizing that uses Cross FETs.

Turning now to FIG. 5, a generalized block diagram of a top view of a standard cell layout 500 is shown. The standard cell layout 500 (or layout 500) on the right is a continuation of the semiconductor processing steps being performed on the layout 400 for an inverter using Cross FETs. A cross-sectional view of the semiconductor layers used in the layout 500 also accompanies the layout 500 and it is shown on the left. A silicon nitride layer 502 and additional ILD oxide 310 are formed on the initial ILD oxide 310 layer. For example, a silicon nitride (SiNx) layer 502 is deposited on the ILD oxide 310 layer.

The chemical and electrical properties of amorphous hydrogenated silicon nitride (SiNx) make this material a good candidate for an insulating layer in integrated circuits. In some embodiments, the silicon nitride layer 502 is formed from silane (SiH4) and ammonia (NH3) with the plasma enhanced chemical vapor deposition (PECVD) technique. In other embodiments, the silicon nitride layer 502 is formed with the low-pressure chemical vapor deposition (LPCVD) technique. Each of the nitride layer 502 and the ILD oxide 310 layer are etched to create space for the gate contact 504. Similarly, the nitride layer 502 and the ILD oxide 310 layer are etched to create space for the drain contact 506. The gate contact 504 and the drain contract 506 are deposited in the created spaces.

Figure 6:
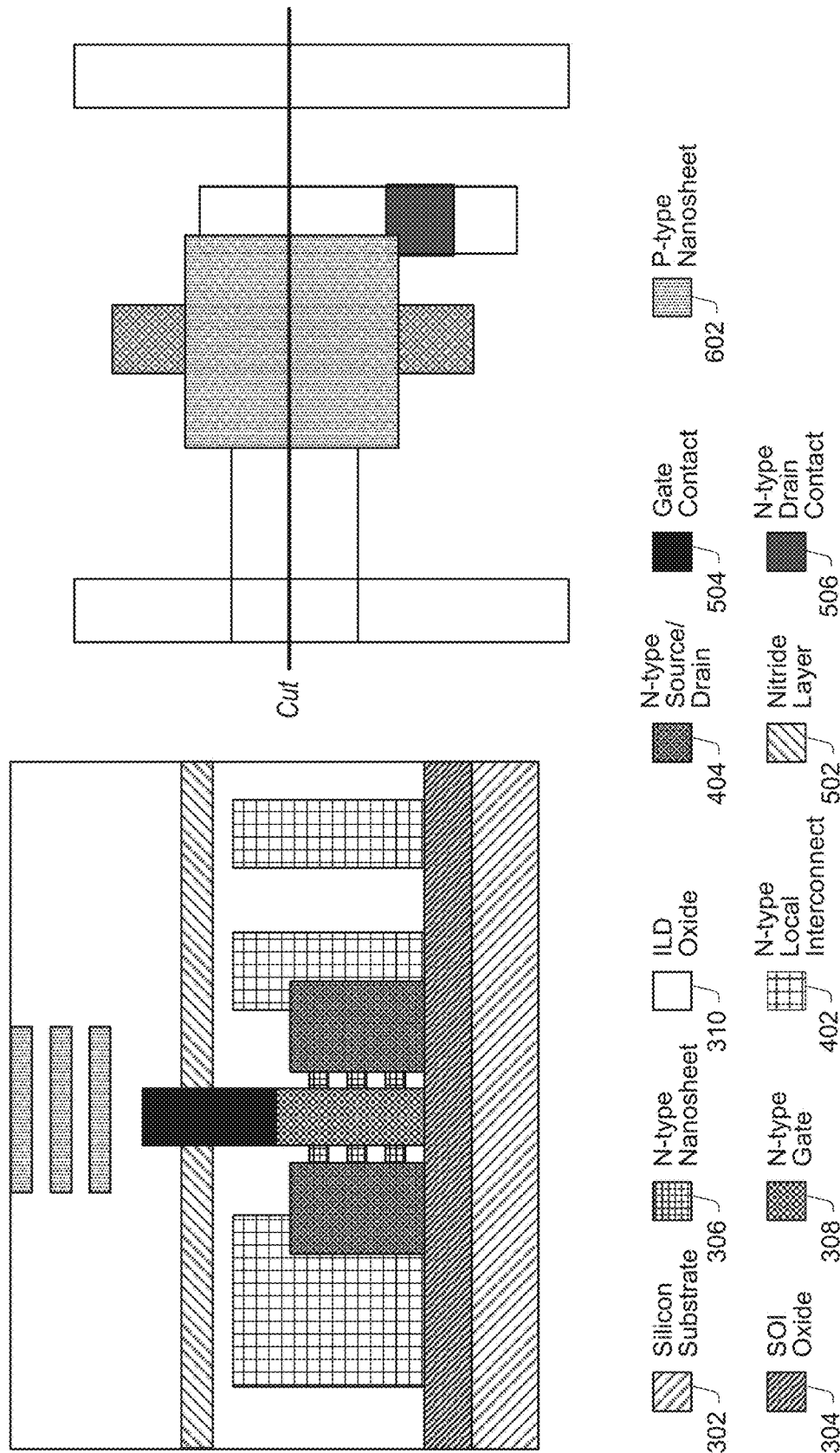
FIG. 6 is a generalized diagram of a top view of a standard cell layout utilizing that uses Cross FETs.

Referring to FIG. 6, a generalized block diagram of a top view of a standard cell layout 600 is shown. The standard cell layout 600 (or layout 600) on the right is a continuation of the semiconductor processing steps being performed on the layout 500 for an inverter using Cross FETs. A cross-sectional view of the semiconductor layers used in the layout 600 also accompanies the layout 600 and it is shown on the left. A stack of channels is formed over the n-type gate contact 504 in the ILD oxide layer 310. In an implementation, the stack of channels are p-type nanosheets 602. In some implementations, on top of a silicon substrate of a separate wafer are grown alternating layers such as a silicon germanium semiconducting epitaxial growth layer alternating with a silicon semiconducting epitaxial growth layer. In some implementations, the silicon germanium semiconducting epitaxial growth layers are selected for building the p-type nanosheets 602. In other implementations, the silicon epitaxial growth layers are selected for building the p-type nanosheets 602.

When the silicon germanium semiconducting epitaxial growth layers are selected, the leftover silicon nanosheets on the separate wafer are etched and silicon germanium cladding layers are epitaxially grown on the silicon nanosheets. Alternatively, the silicon nanosheets on the separate wafer are removed leaving the and leave the silicon germanium semiconducting epitaxial growth layers as the remaining layers to form the p-type nanosheets 602. A relatively thin silicon dioxide layer is grown on the selected one of the alternating layers to provide the p-type nanosheets 602 in the gate region. The separate wafer with the alternating layers is bonded to the top of ILD oxide layer 310 of the layout 500 (of FIG. 5). In other implementations, the alternating layers are grown on top of ILD oxide layer 310 of the layout 500 followed by one of the earlier named processes for etching the layers to the size of the p-type nanosheets 602. The earlier named processes were described in relation to forming the n-type nanosheets 306.

Figure 7:
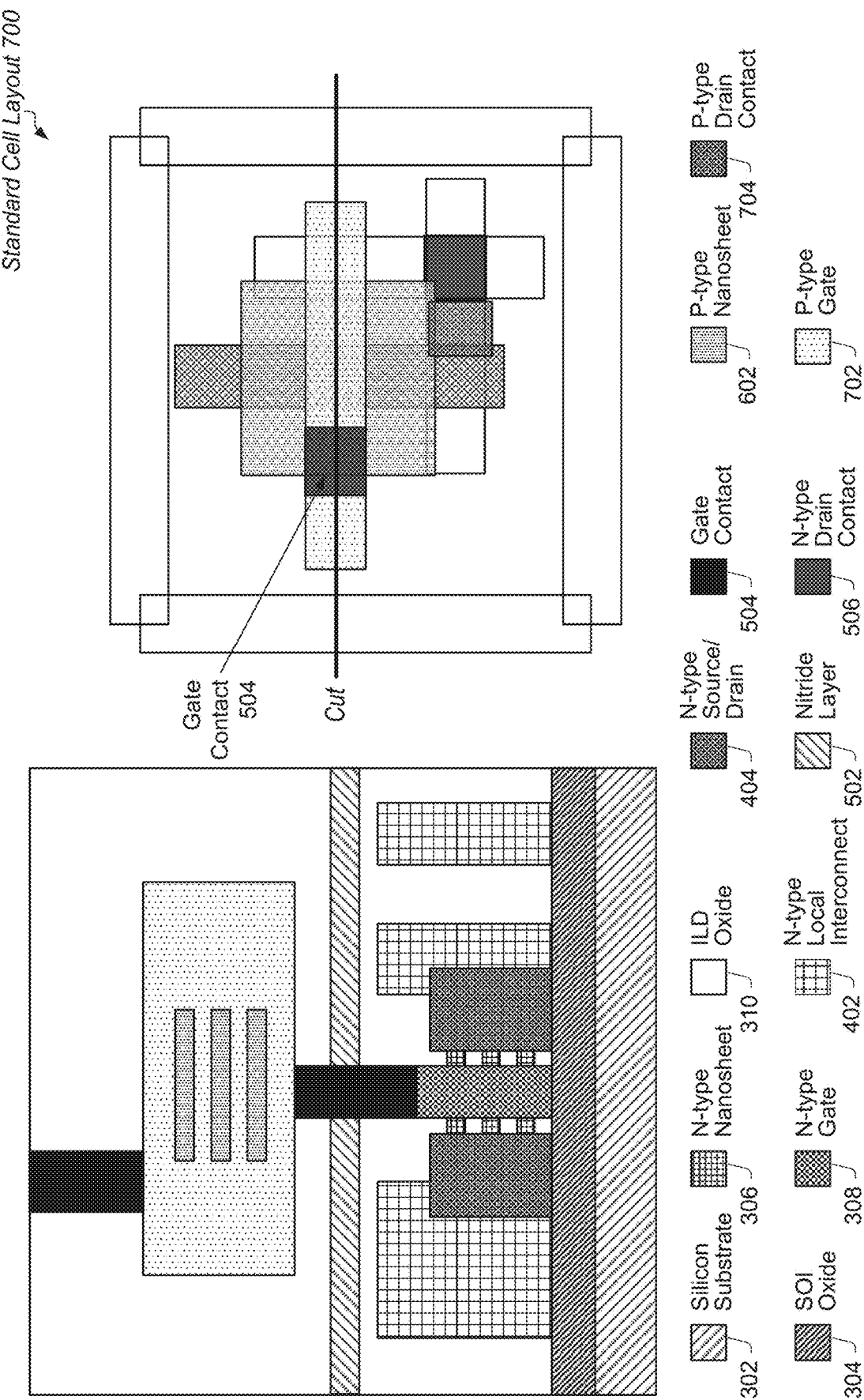
FIG. 7 is a generalized diagram of a top view of a standard cell layout utilizing that uses Cross FETs.

Turning now to FIG. 7, a generalized block diagram of a top view of a standard cell layout 700 is shown. The standard cell layout 700 (or layout 700) on the right is a continuation of the semiconductor processing steps being performed on the layout 600 for creating an inverter using Cross FETs. A cross-sectional view of the semiconductor layers used in the layout 700 also accompanies the layout 700 and it is shown on the left. The ILD oxide 310 layer is etched to create space for the gate contact 702, which is placed all around the p-type nanosheets 602. Similarly, the ILD oxide 310 layer is etched to create space for the drain contact 704. The gate contact 504 and the drain contract 704 are deposited in the created spaces.

Figure 8:
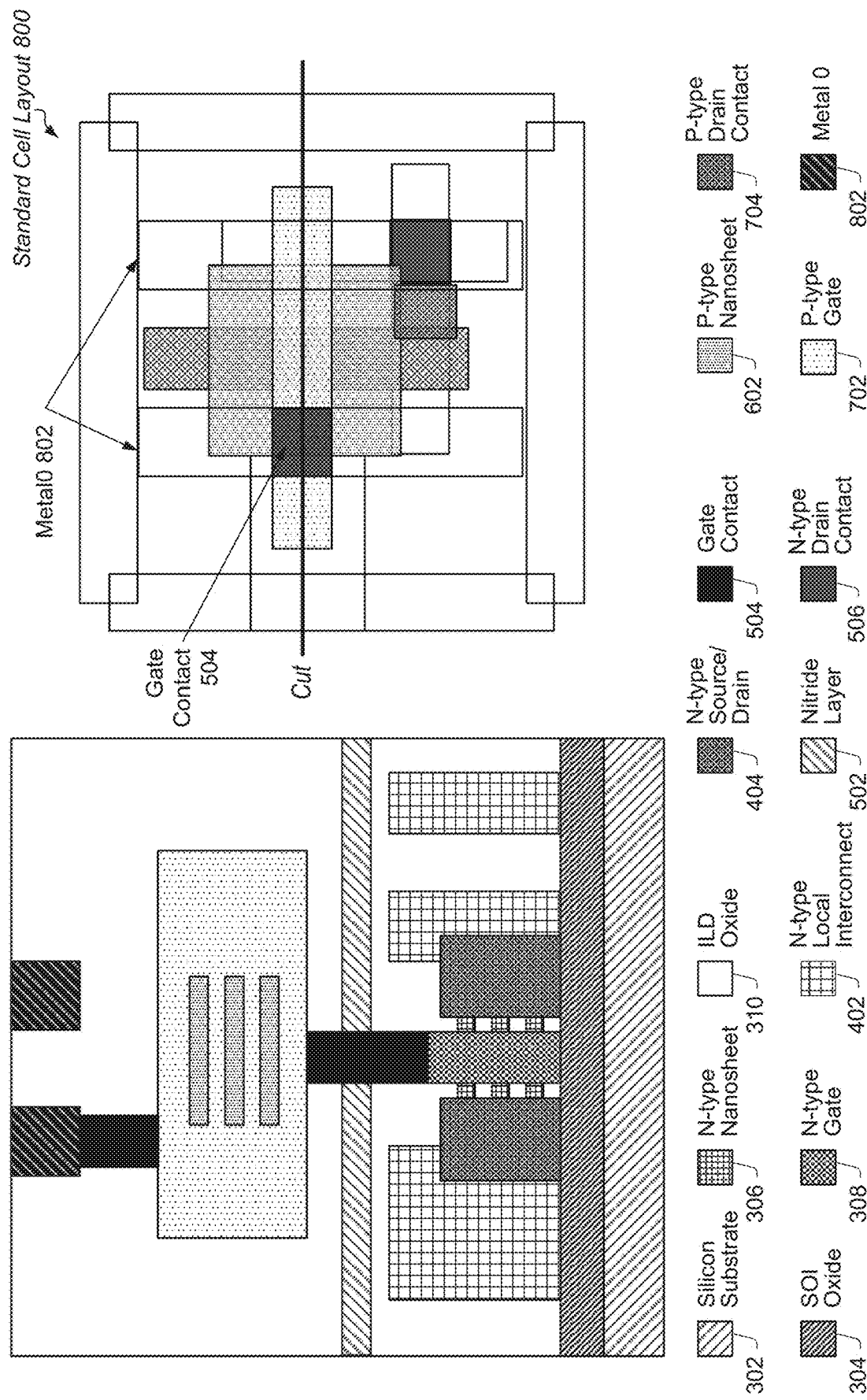
FIG. 8 is a generalized diagram of a top view of a standard cell layout utilizing that uses Cross FETs.

Referring to FIG. 8, a generalized block diagram of a top view of a standard cell layout 800 is shown. The standard cell layout 800 (or layout 800) on the right is a continuation of the semiconductor processing steps being performed on the layout 700 for creating an inverter using Cross FETs. A cross-sectional view of the semiconductor layers used in the layout 800 also accompanies the layout 800 and it is shown on the left. Here, metal 0 (M0 or Metal0) 802 is deposited for creating further connections for the inverter.

Figure 9:
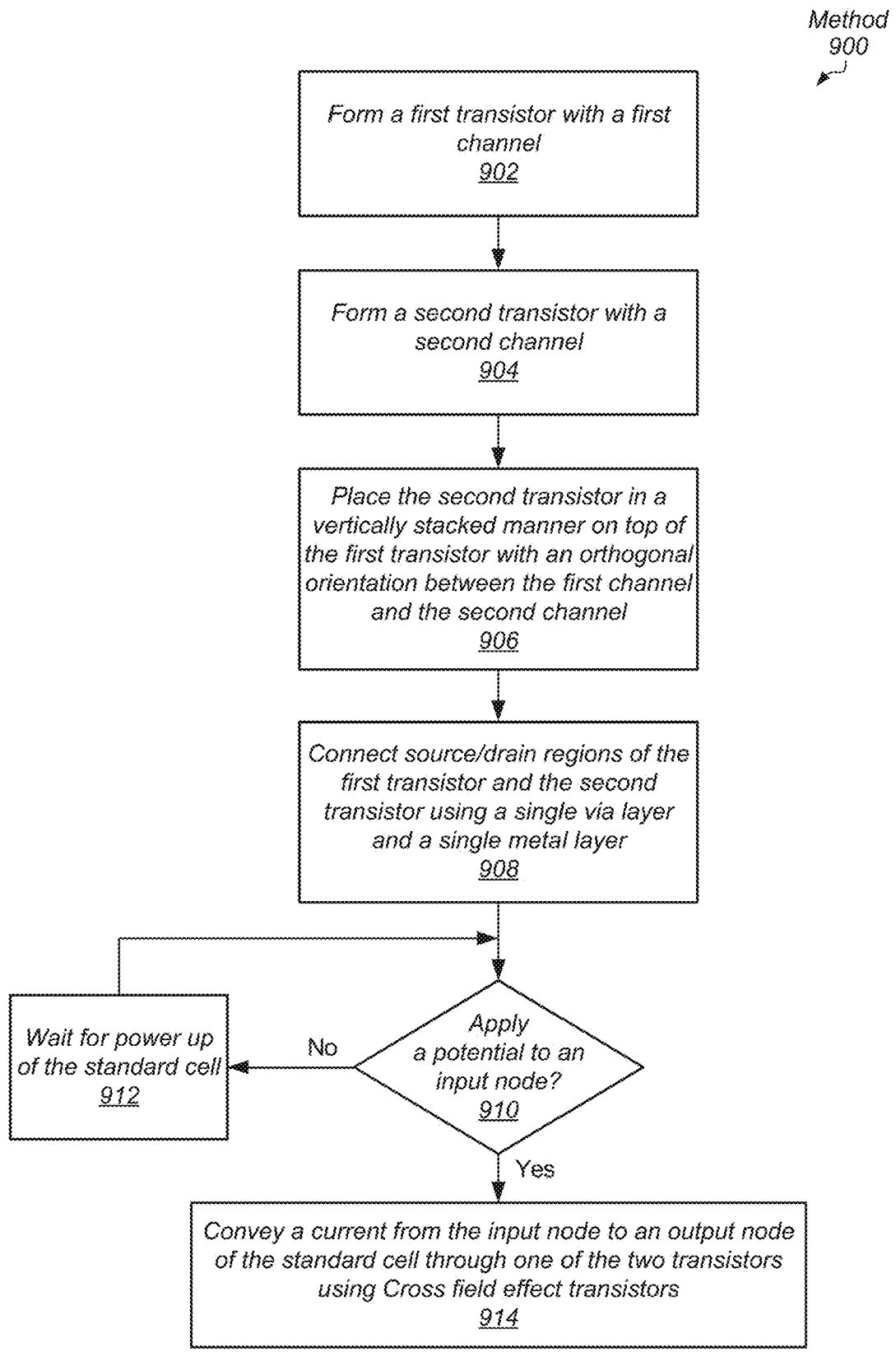
FIG. 9 is a generalized diagram of one embodiment of a method for efficiently creating layout for standard cells that utilize Cross FETs.

Referring now to FIG. 9, one embodiment of a method 900 for efficiently creating layout for standard cells that utilize Cross FETs is shown. For purposes of discussion, the steps in this embodiment are shown in sequential order. However, in other embodiments some steps occur in a different order than shown, some steps are performed concurrently, some steps are combined with other steps, and some steps are absent.

A first transistor is formed with a first channel is formed (block 902). A second transistor with a second channel is formed (block 904). In some implementations, each of the first transistor and the second transistor is formed as a vertical gate all around (GAA) device. The second transistor is placed in a vertically stacked manner on top of the first transistor with an orthogonal orientation between the first channel and the second channel (block 906). The source/drain regions of the first transistor and the second transistor are connected using a single via layer and a single metal layer (block 908).

If a potential is not applied to an input node of the standard cell ("no" branch of the conditional block 910), then the standard cell waits for power up (block 912). However, if a potential is applied to the input node of the standard cell ("yes" branch of the conditional block 910), then the circuitry of the standard cell conveys a current from the input node to an output node of the standard cell through one of the two transistors using Cross field effect transistors (block 914).

Referring to FIG. 10, a generalized block diagram of a top view of a standard cell layout 1000 is shown. The standard cell layout 1000 (or layout 1000) is a continuation of the semiconductor processing steps being performed on the layout 500 (of FIG. 5) for creating an inverter using Cross FETs. Here, a separate wafer has alternating layers grown such as a silicon germanium semiconducting epitaxial growth layer 1002 alternating with a silicon semiconducting epitaxial growth layer 1004. The separate wafer with the alternating layers 1002 and 1004 is bonded to the top of ILD oxide layer 310 and the gate contact 504 of the layout 500 (of FIG. 5). Referring to FIG. 11, a generalized block diagram of a top view of a standard cell layout 1100 is shown. The standard cell layout 1100 (or layout 1100) is a continuation of the semiconductor processing steps being performed on the layout 1000 (of FIG. 10) for creating an inverter using Cross FETs. The wafer with the alternating layers 1002 and 1004 is bonded to the top of ILD oxide layer 310 and gate contact 504 of the layout 500. As described earlier, the bonding is performed by any of a number of wafer-to-wafer bonding techniques such as copper-based wafer bonding, which is also known as thermo-compression bonding, and oxide-oxide bonding, which is also known as molecular, fusion or direct wafer bonding.

Figure 12:
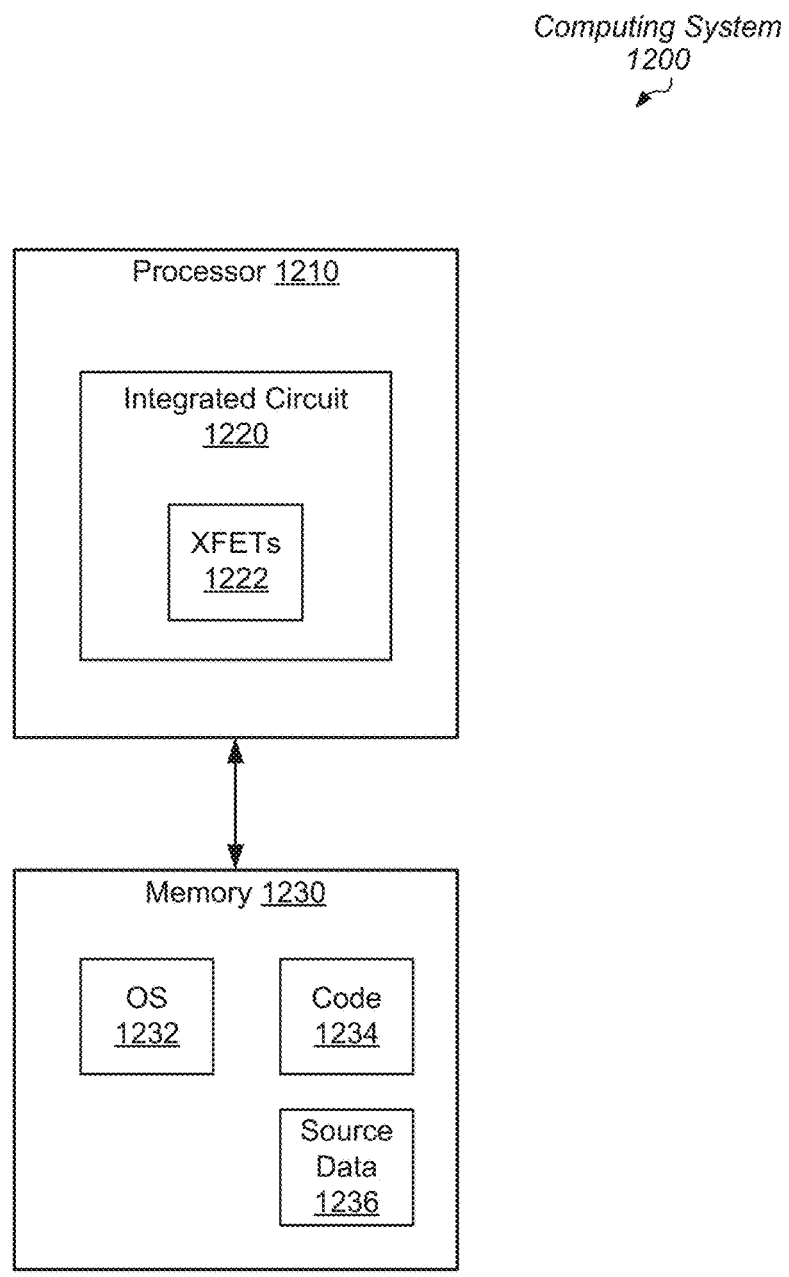
FIG. 12 is a generalized diagram of computing system with a processor that includes standard cells that utilize Cross FETs.

Referring to FIG. 12, one embodiment of a computing system 1200 is shown. The computing system 1200 includes the processor 1210 and the memory 1230. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 1200 includes one or more of other processors of a same type or a different type than processor 1210, one or more peripheral devices, a network interface, one or more other memory devices, and so forth. In some implementations, the functionality of the computing system 1200 is incorporated on a system on chip (SoC). In other implementations, the functionality of the computing system 1200 is incorporated on a peripheral card inserted in a motherboard. The computing system 1200 is used in any of a variety of computing devices such as a desktop computer, a tablet computer, a laptop, a smartphone, a smartwatch, a gaming console, a personal assistant device, and so forth.

The processor 1210 includes hardware such as circuitry. For example, the processor 1210 includes at least one integrated circuit 1220, which utilizes Cross FETs 1222. For example, one or more standard cells are instantiated in the integrated circuit 1220. These standard cells include Cross FETs 1222. The Cross FETs 1222 are representative of the Cross FETs used in the 2-input Boolean NAND gate of layout 100-200 (of FIGS. 1-2 and the inverter of layout 800 (of FIG. 8).

In various implementations, the processor 1210 includes one or more processing units. In some implementations, each of the processing units includes one or more processor cores capable of general-purpose data processing, and an associated cache memory subsystem. In such an implementation, the processor 1210 is a central processing unit (CPU). In another implementation, the processing cores are compute units, each with a highly parallel data microarchitecture with multiple parallel execution lanes and an associated data storage buffer. In such an implementation, the processor 1210 is a graphics processing unit (GPU), a digital signal processor (DSP), or other.

In some implementations, the memory 1230 includes one or more of a hard disk drive, a solid-state disk, other types of flash memory, a portable solid-state drive, a tape drive and so on. The memory 1230 stores an operating system (OS) 1232, one or more applications represented by code 1234, and at least source data 1236. Memory 1230 is also capable of storing intermediate result data and final result data generated by the processor 1210 when executing a particular application of code 1234. Although a single operating system 1232 and a single instance of code 1234 and source data 1236 are shown, in other implementations, another number of these software components are stored in memory 1230. The operating system 1232 includes instructions for initiating the boot up of the processor 1210, assigning tasks to hardware circuitry, managing resources of the computing system 1200 and hosting one or more virtual environments.

Each of the processor 1210 and the memory 1230 includes an interface unit for communicating with one another as well as any other hardware components included in the computing system 1200. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:
1. An integrated circuit comprising:
a first transistor comprising a first channel oriented in a first direction and a drain region with a length greater than a width of the first channel by at least a width of a drain contact;
an oxide layer adjacent to the first transistor; and
a second transistor adjacent to the oxide layer, wherein the second transistor comprises a second channel that is oriented in a direction orthogonal to the first direction; and
wherein responsive to a potential being applied to an input node of a cell of the integrated circuit, a current is conveyed from the input node to an output node of the cell through one of the first transistor and the second transistor.

2. The integrated circuit as recited in claim 1, wherein:
a channel comprises a nanosheet; and
each of the first transistor and the second transistor is a gate all around (GAA) device.

3. The integrated circuit as recited in claim 1, wherein a first doping polarity of the first channel is an opposite polarity of a second doping polarity of the second channel.

4. The integrated circuit as recited in claim 1, wherein the second channel is formed on a wafer that is bonded with the oxide layer.

5. The integrated circuit as recited in claim 1, further comprising:
a single via layer between the first transistor and the second transistor; and
a vertical gate contact directly connected to a first metal gate at a first end and directly connected to a second metal gate at a second end.

6. The integrated circuit as recited in claim 1, wherein an end of the drain contact connects to the drain region in an area of the drain region located externally from any area of the drain region overlapping with the first channel.

7. The integrated circuit as recited in claim 5, further comprising a first local interconnect stacked on and adjacent to a first drain region of the first transistor, wherein the first local interconnect has a dimension greater than a corresponding dimension of the first drain contact.

8. A method comprising:
placing, in an integrated circuit, a first transistor and a second transistor;
forming the first transistor with a first channel oriented in a first direction and a drain region with a length greater than a width of the first channel by at least a width of a drain contact;
forming an oxide layer adjacent to the first transistor;
forming the second transistor adjacent to the oxide layer, wherein the second transistor comprises a second channel that is oriented in a direction orthogonal to the first direction; and
responsive to a power supply voltage being applied to an input node of a cell of the integrated circuit, conveying a current from the input node to an output node of the cell through one of the first transistor and the second transistor.

9. The method as recited in claim 8, wherein:
a channel comprises a nanosheet; and
each of the first transistor and the second transistor is a gate all around (GAA) device.

10. The method as recited in claim 8, further comprising forming the first channel with a first doping polarity that is an opposite polarity of a second doping polarity of the second channel.

11. The method as recited in claim 8, further comprising forming the second channel on a wafer that is bonded with the oxide layer.

12. The method as recited in claim 8, further comprising:
placing a single via layer between the first transistor and the second transistor; and
placing a vertical gate contact directly connected to a first metal gate at a first end and directly connected to a second metal gate at a second end.

13. The method as recited in claim 8, further comprising placing an end of the drain contact that connects to the drain region in an area of the drain region located externally from any area of the drain region overlapping with the first channel.

14. The method as recited in claim 12, further comprising forming a first local interconnect stacked on and adjacent to a first drain region of the first transistor, wherein the first local interconnect has a dimension greater than a corresponding dimension of the first drain contact.

15. A computing system comprising:
a memory comprising circuitry configured to store instructions of one or more tasks and source data to be processed by the one or more tasks;
an integrated circuit configured to execute the instructions using the source data, wherein the integrated circuit comprises:
a first transistor comprising a first channel oriented in a first direction and a drain region with a length greater than a width of the first channel by at least a width of a drain contact;
an oxide layer adjacent to the first transistor; and
a second transistor adjacent to the oxide layer, wherein the second transistor comprises a second channel that is oriented in a direction orthogonal to the first direction; and
wherein responsive to a potential being applied to an input node of a cell of the integrated circuit, a current is conveyed from the input node to an output node of the cell through one of the first transistor and the second transistor.

16. The computing system as recited in claim 15, wherein:
a channel comprises a nanosheet; and
each of the first transistor and the second transistor is a gate all around (GAA) device.

17. The computing system as recited in claim 15, wherein a first doping polarity of the first channel is an opposite polarity of a second doping polarity of the second channel.

18. The computing system as recited in claim 15, wherein the second channel is formed on a wafer that is bonded with the oxide layer.

19. The computing system as recited in claim 15, wherein the integrated circuit further comprises:
a single via layer between the first transistor and the second transistor; and
a vertical gate contact directly connected to a first metal gate at a first end and directly connected to a second metal gate at a second end.

20. The computing system as recited in claim 15, wherein an end of the drain contact connects to the drain region in an area of the drain region located externally from any area of the drain region overlapping with the first channel.

* * * * *